(12) United States Patent
Andry et al.

(10) Patent No.: US 8,354,737 B2
(45) Date of Patent: Jan. 15, 2013

(54) SMALL AREA, ROBUST SILICON VIA STRUCTURE AND PROCESS

(75) Inventors: Paul S Andry, Yorktown Heights, NY (US); John M Cotte, New Fairfield, CT (US); John Ulrich Knickerbocker, Monroe, NY (US); Cornelia K Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/983,552

(22) Filed: Jan. 3, 2011

(65) Prior Publication Data
US 2011/0095428 A1 Apr. 28, 2011

Related U.S. Application Data

(62) Division of application No. 11/833,112, filed on Aug. 2, 2007, now Pat. No. 7,902,069.

(51) Int. Cl.
*H01L 21/44* (2006.01)
(52) U.S. Cl. ............... 257/621; 257/E21.585; 438/639; 438/637
(58) Field of Classification Search ............ 257/621
See application file for complete search history.

(56) References Cited

U.S. PATENT DOCUMENTS

2005/0121768 A1* 6/2005 Edelstein et al. ............ 257/698

OTHER PUBLICATIONS

Streetman, Ben G. and Banerjee, Sanjay Kumar, "Solid State Electronic Devices", 2000, Pearson Prentice Hall, Sixth Edition, pp. 470-473.*
Dally, James W., "Packaging of Electronic Systems—A Mechanical Engineering Approach", 1990.*
"Microprocessors" from http://www.kids-online.net/learn/click/details/micropro.html, Aug. 23, 2000 (Date provided by archive.com waybackmachine).*

* cited by examiner

*Primary Examiner* — Ajay K Arora
(74) *Attorney, Agent, or Firm* — Michael J. Buchenhorner; Vazken Alexanian

(57) ABSTRACT

A semiconductor structure includes: at least one silicon surface wherein the surface can be a substrate, wafer or other device. The structure further includes at least one electronic circuit formed on each side of the at least one surface; and at least one conductive high aspect ratio through silicon via running through the at least one surface. Each through silicon via is fabricated from at least one etch step and includes: at least one thermal oxide dielectric for coating at least some of a sidewall of the through silicon via for a later etch stop in fabrication of the through silicon via.

13 Claims, 18 Drawing Sheets

Cross-section diagonal view of one annular etch.

Cross-section diagonal view of a double annular etch.

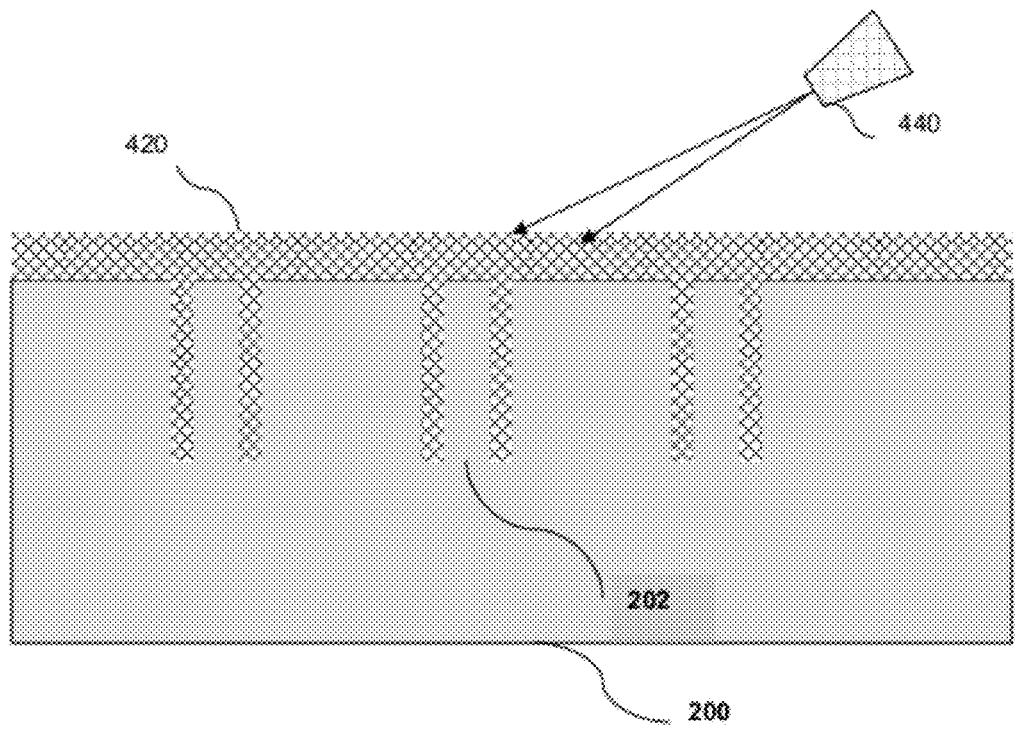
*FIG. 4A Cross section of three single annular structures after SiOx thermal oxidation and / or dielectric depositions*

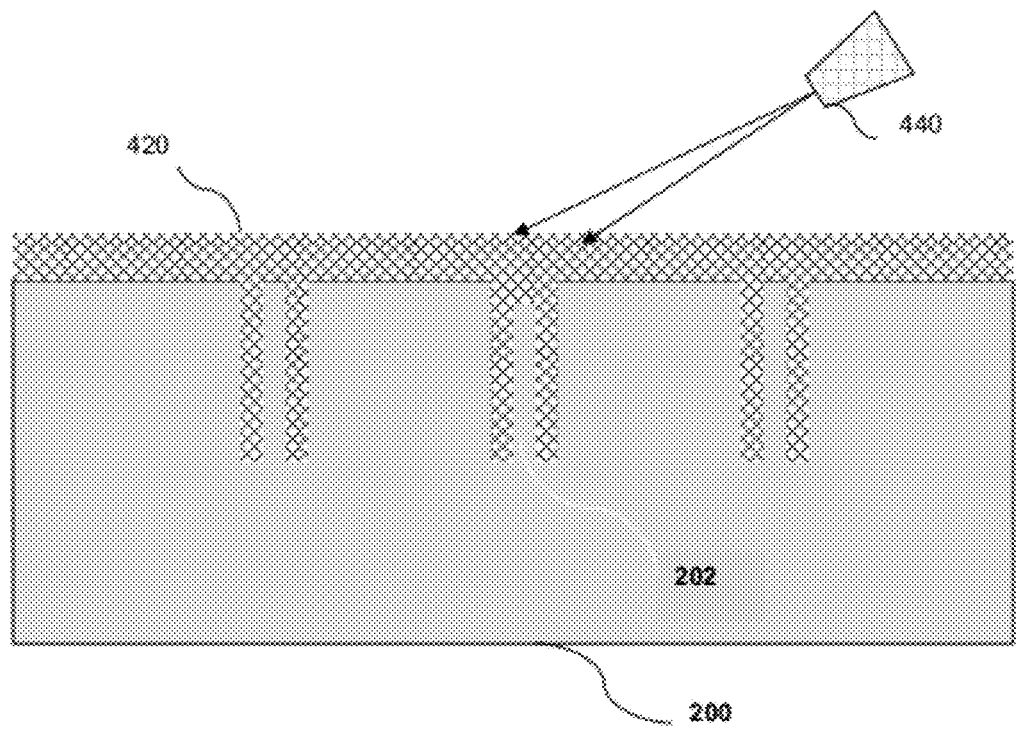
*FIG. 4B Cross section of 3 individual bar or small diameter TSVs with grown thermal oxide and added surface dielectric to cover TSV over empty TSV or temporary filled polysilicon TSV*

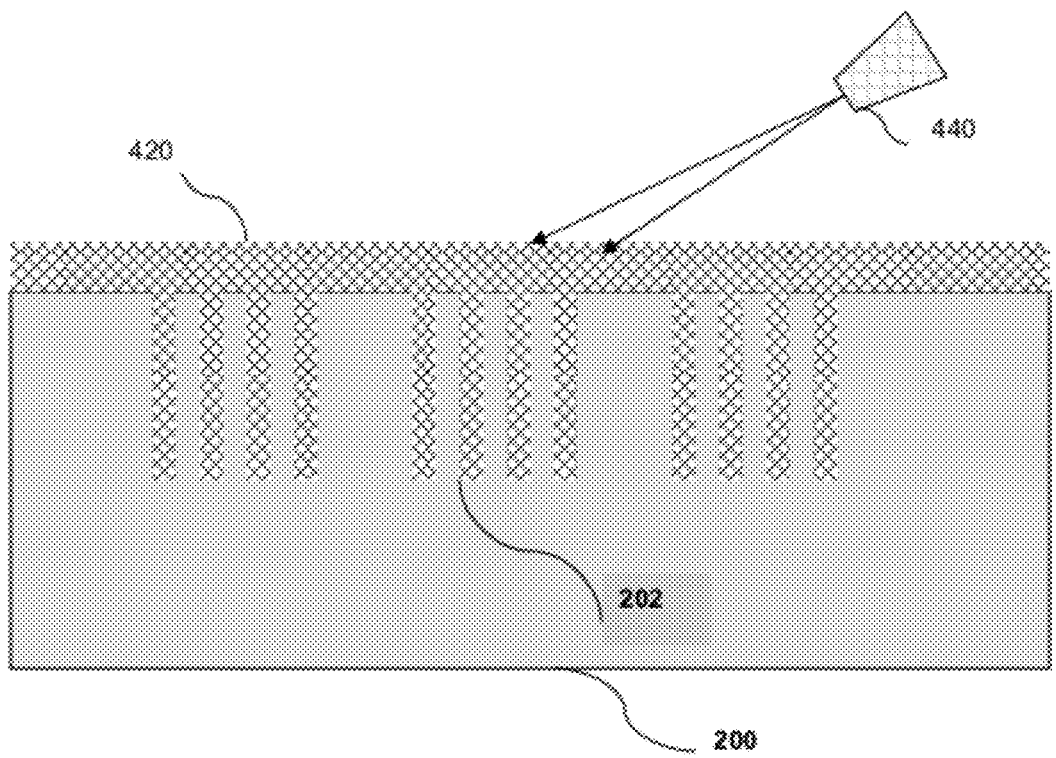
FIG. 4C Cross section of three double annular TSVs etched with insulator

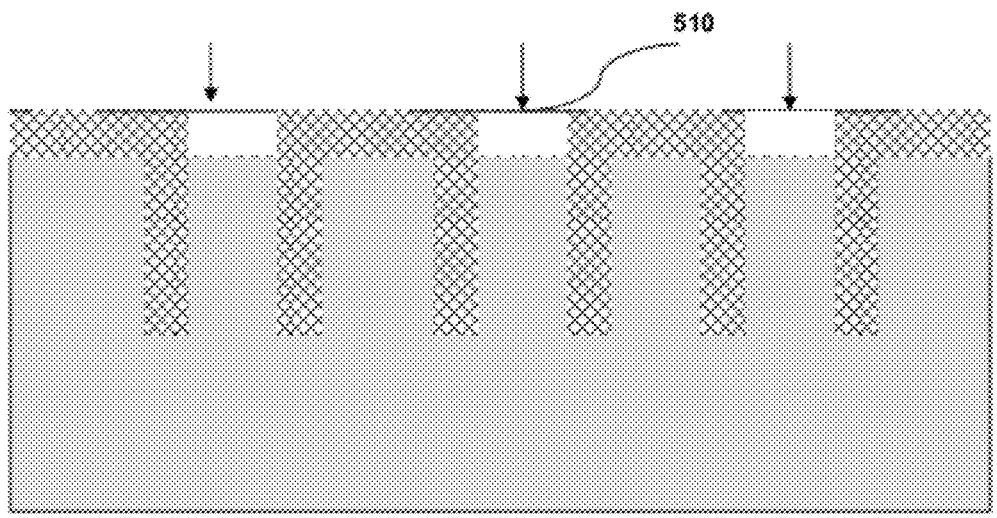
*FIG. 5*
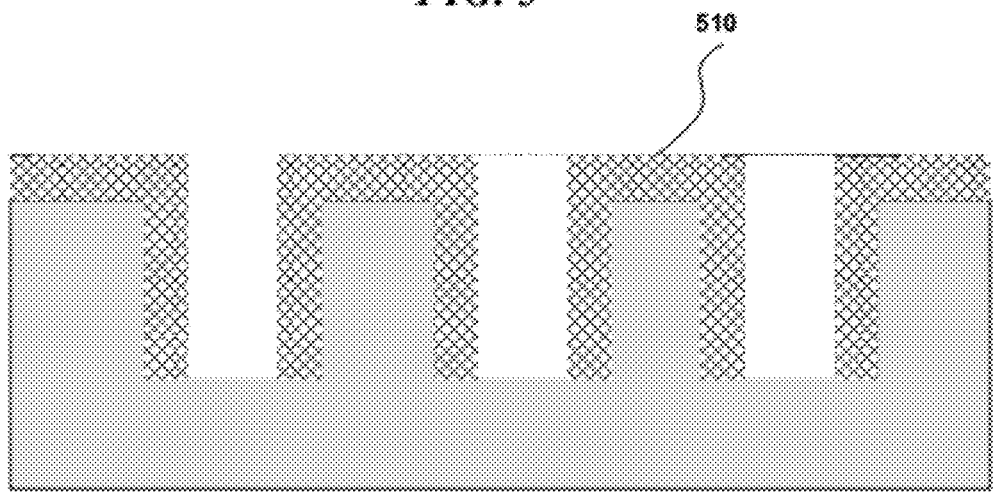
*FIG. 6 – Deep Si Etch*

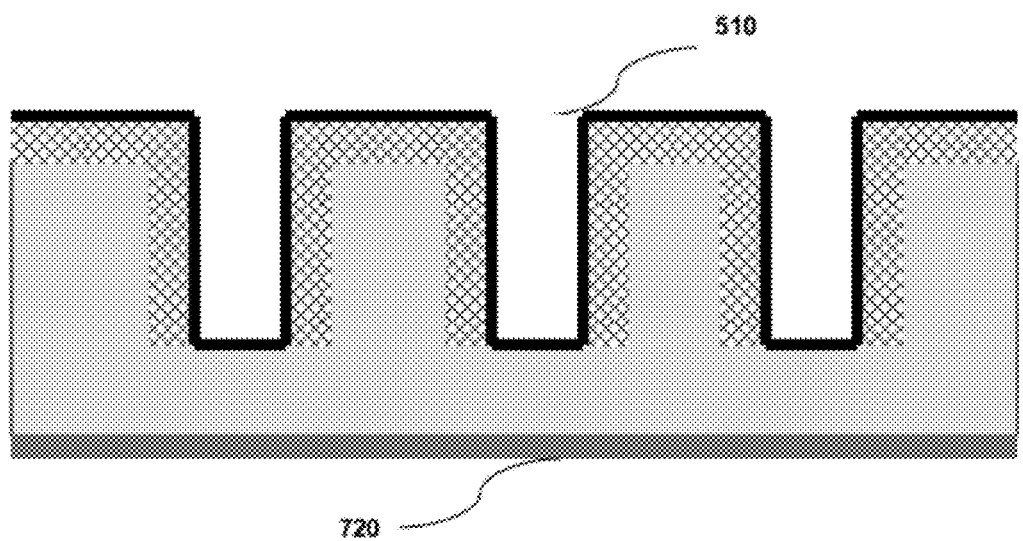
*FIG. 7 – Liner/Barrier Deposition*

TSV First Process

*TSV Second Process*

*TSV Third Process*

SMALL AREA, ROBUST SILICON VIA STRUCTURE AND PROCESS

CROSS-REFERENCE TO RELATED APPLICATIONS

This application is a division of, and claims priority from, commonly-owned and co-pending U.S. patent application Ser. No. 11/833,112, filed on Aug. 2, 2007. Moreover, the present invention is related to the subject matter of the following commonly assigned applications: United States Patent Publication 2005/0121768, "Si Chip Carrier with Conductive Through Vias," filed Dec. 5, 2003; U.S. patent application Ser. No. 11/214,602, "Conductive Thru Via Structure and Process for Electronic Device Carriers" filed Aug. 30, 2005; and U.S. patent application Ser. No. 11/620,423, "Manufacturing Si Thru Via." The content of the above-referenced applications is incorporated herein by reference.

STATEMENT REGARDING FEDERALLY SPONSORED-RESEARCH OR DEVELOPMENT

The invention described herein was funded in part by a grant from the National Security Agency DARPA Program, Contract No. H98230-04-C-0920, and in part by DARPA, Contract No. NBCH3039004. The United States Government may have certain rights under the invention.

INCORPORATION BY REFERENCE OF MATERIAL SUBMITTED ON A COMPACT DISC

Not Applicable.

FIELD OF THE INVENTION

The present invention broadly relates to the field of silicon wafer etching and more particularly relates to the field of deep etching of silicon using a reactive process.

BACKGROUND OF THE INVENTION

In silicon chip etching, a hole, or via, is machined through a substrate (die) or through multiple stacked dice to create a path for the interconnects. For some silicon chips, many holes must be etched on a very small surface. Additionally, the holes must have a high aspect ratio (deep, but not wide). Chips used in today's computing devices must combine high performance and low cost with small size. Therefore, many of these chips are packaged in stacked sets. "Through Silicon Via" (TSV) interconnection technology is used for machining these high density memory chip packages. This technique involves creating vertical connections through the stacked chips. The stacked chips are interconnected by wire bonding, which requires deep vertical gaps with a high aspect ratio. These micron-sized holes penetrate through the silicon vertically to connect circuits directly to the processor. The addition of the vertical connections creates a three-dimensional interconnect.

One of the most widely used technologies for chip etching is the dry etching process. The dry etching technology can be split into three separate classes called reactive ion etching (RIE), sputter etching, and vapor phase etching. In RIE, the substrate is placed inside a reactor in which several gases are introduced. Plasma is struck in the gas mixture using an RF power source, breaking the gas molecules into ions. The ions are accelerated towards, and react at, the surface of the material being etched, forming another gaseous material. This is known as the chemical part of reactive ion etching. There is also a physical part which is similar in nature to the sputtering deposition process. If the ions have high enough energy, they can knock atoms out of the material to be etched without a chemical reaction. It is a very complex task to develop dry etch processes that balance chemical and physical etching, since there are many parameters to adjust. By changing the balance it is possible to influence the anisotropy of the etching, since the chemical part is isotropic and the physical part highly anisotropic the combination can form sidewalls that have shapes from rounded to vertical. A schematic of a typical reactive ion etching system is shown in the figure below.

Referring to FIG. 1 there is shown an illustration of a reactive ion etching system used for etching on silicon wafers. A reactor 120 encloses the gases and plasma used in the process. In this example, there are four wafers 130 mounted on a wafer holder 160 which is also an electrode. Gas is introduced into the reactor through the tubes 190 and is blown out through the diffuser nozzles 180. The gas mixes with the plasma layer 150 sandwiched in between the wafer holder 160 and an upper electrode 140. A radio frequency (RF) signal is sent into the mechanism through an insulator 170 directed toward the plasma layer 150 which breaks the gas molecules into reactive ions The ions are accelerated towards, and react at, the surface of the wafer 130.

A special subclass of RIE which continues to grow rapidly in popularity is deep RIE (DRIE). In this process, etch depths of hundreds of microns can be achieved with almost vertical sidewalls. The primary technology is based on the so-called "Bosch process," named after the German company Robert Bosch which filed the original patent, where two different gas compositions are alternated in the reactor. The first gas composition creates a polymer on the surface of the substrate, and the second gas composition etches the substrate. The polymer is immediately sputtered away by the physical part of the etching, but only on the horizontal surfaces and not the sidewalls. Since the polymer only dissolves very slowly in the chemical part of the etching, it builds up on the sidewalls and protects them from etching. As a result, etching aspect ratios of 50 to 1 can be achieved. In MEMS (Micro-Electrical-Mechanical Systems) technology the etched structures range in depths from 10 microns to 500 microns. The process can easily be used to etch completely through a silicon substrate, and etch rates are three to four times higher than wet etching.

Sputter etching is essentially RIE without reactive ions. The systems used are very similar in principle to sputtering deposition systems. The big difference is that substrate is now subjected to the ion bombardment instead of the material target used in sputter deposition.

Vapor phase etching is another dry etching method, which can be done with simpler equipment than what RIE requires. In this process the wafer to be etched is placed inside a chamber, in which one or more gases are introduced. The material to be etched is dissolved at the surface in a chemical reaction with the gas molecules. The two most common vapor phase etching technologies are silicon dioxide etching using hydrogen fluoride (HF) and silicon etching using xenon diflouride ($XeF_2$), both of which are isotropic in nature. Usually, care must be taken in the design of a vapor phase process to not have bi-products form in the chemical reaction that condense on the surface and interfere with the etching process.

Dry etching is an enabling technology, which comes at a sometimes high cost. It requires expensive equipment, and the etching proceeds at a relatively slow rate. Therefore, there is a need for an etching technique that overcomes the problems in the prior art.

SUMMARY OF THE INVENTION

Briefly, according to an embodiment of the invention a semiconductor structure includes: at least silicon substrate; one or more electronic circuits formed on each side of the at least one substrate; one or more conductive vias through the at least one substrate, each via including one or more thermal oxide dielectrics. The vias may also include tungsten and/or copper. The diameter, annular width or bar (slotted) width of the vias is approximately 0.3 to 6 microns for tungsten or a combination of tungsten and polysilicon fill. For copper vias, the width is approximately 0.2 to 8 microns.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 4A illustrates the deep annular etching of FIG. 1 with a grown thermal oxide coating, according to an embodiment of the invention;

FIG. 4B illustrates the deep slotted etching of FIG. 2B with a grown thermal oxide coating, polysilicon filled via and thermal surface coating or thermal surface coating over the partially oxidized via;

FIG. 4C illustrates the deep double annular etched via of FIG. 3C with grown thermal oxide filling the etched annular vias;

FIG. 5 shows the addition of active circuits and or passive circuits and illustrates a patterned oxide etch over the inner diameter or targeted via;

FIG. 6 illustrates a deep Si Etch;

FIG. 7 illustrates the liner/barrier deposition;

DETAILED DESCRIPTION

The figures and related text describe a method and structure for fabrication of silicon through vias in a small area for three-dimensional (3D) chip interconnection. The high aspect ratio via structures are capable of small area impact on circuits, and combine low stress during wafer processing with robust mechanical integrity for reliability.

According to an embodiment of the present invention, a thermal oxide dielectric with a tungsten (W) or copper (Cu) conductor is used for fabricating through vias wiring with active or passive circuits. Small vias (0.2 to 4 micron width) are prefabricated using RIE (reactive ion etching). The small size minimizes the area impact on active circuits and permits compatibility while maintaining low stress in processing 300 mm wafers. A thermal oxide collar is then applied to the vias. After the formation of the thermal oxide collar, the active circuits, trench capacitors and wiring integration can be fabricated.

Prefabrication of thermal oxide using a RIE (reactive ion etching) collar filled thermal oxide allows for the formation of small vias (0.2 to 8 micron width) for oxide and central residual silicon thickness of less than 2 to 150 microns. After formation of the thermal oxide collar, active circuits, trench capacitors and wiring integration can be fabricated.

Through vias can be created with RIE through central remaining silicon and Tungsten (W) CVD (chemical vapor deposition—the transfer of vapor into solids) or Tungsten (W) and poly silicon deposition. Or, CVD copper deposition or Cu plating can be used, where a plating process can deposit added Cu thickness in a short time for through via connections. The thermal dielectric permits robust insulator growth between conductors and silicon and can be controlled in thickness to manage via capacitance, mechanical stress and dielectric robustness in processing and end use. The small TSV size permits robust mechanical integrity for reliability and CVD tungsten permits low cost, fast deposition of the conductor.

Figure 1:
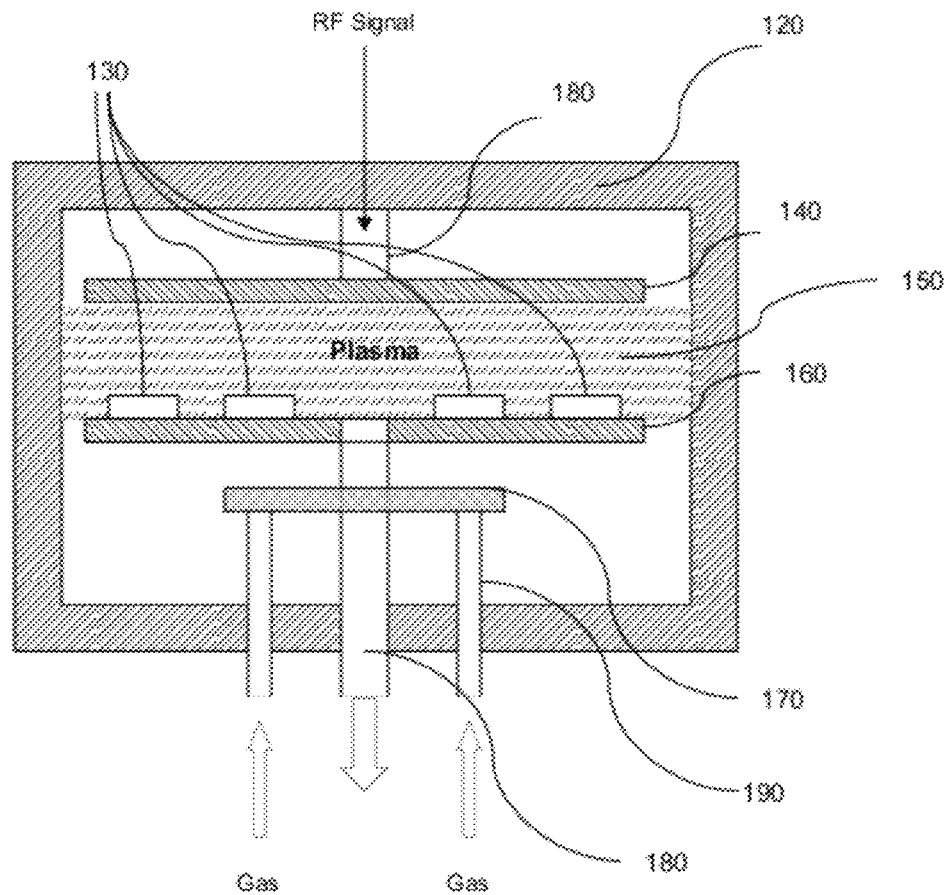
FIG. 1 shows a cross-section of a substrate illustrating reactive ion etching, according to the known art.
Figure 2A:
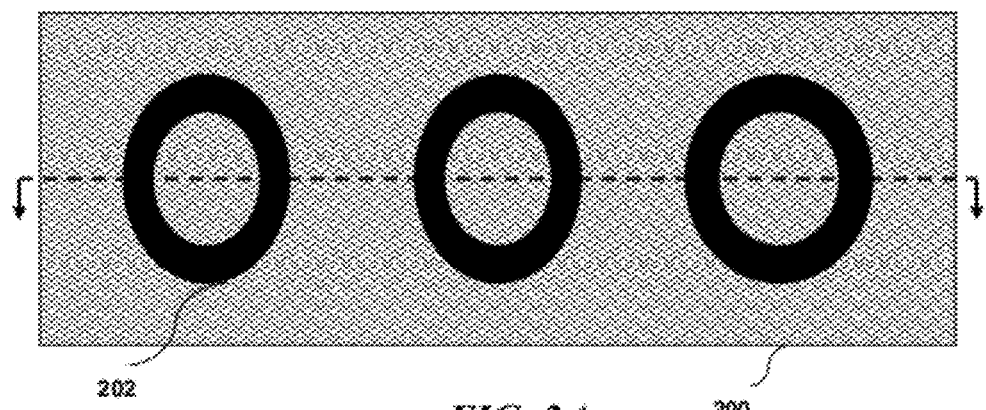
FIG. 2A illustrates a top view of three deep annular etches on a silicon wafer, according to an embodiment of the invention.

Referring to FIG. 2A there is shown a top view of an n-type silicon wafer 200 with three deep annular contact holes, or vias, according to an embodiment of the present invention. A typical wafer is approximately 100 millimeters in diameter. The annular etches 202 shown here are approximately 0.2 to 8 microns wide and 2 to 150 microns deep. Optionally, the wafer 200 could have a backside Arsenic implant. Although the vias 202 shown in this figure are annular, the vias 202 can also be rectangular-shaped, similar to slots, or can be made from a double annular structure or alternative structure with one or more vertical interconnections per TSV and one or more TSVs per wafer.

Figure 2B:
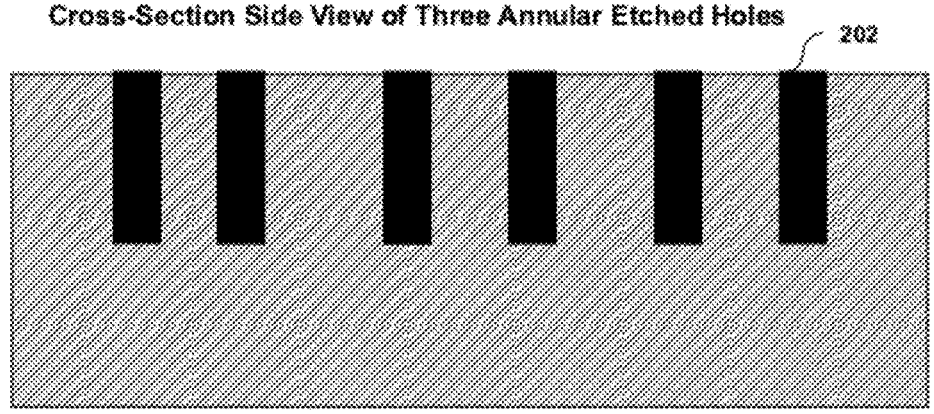
FIG. 2B illustrates a side view, shown in cross-section, of the three annular etched holes of FIG. 2A.

Referring to FIG. 2B there is shown a cross-section view of the silicon wafer 200 with deep annular vias 202. The etching is preferably created using the RIE Bosch process discussed above. The Bosch process is ideal for this step in the method because it is important that the vias 202 are of a small size with a high aspect ratio because if the vias are large in diameter and fully filled with W or Cu then the conductor may lead to failures such as cracking during processing or thermal excursions during fabrication or in final product. This may also cause excessive stress or bowing during fabrication; or it may take an excessively large area for the via and thus detract from the percentage of active circuits for the design.

Figure 3A:
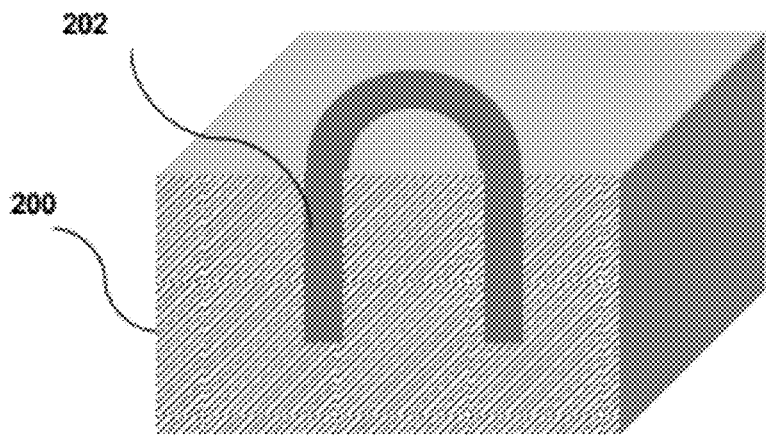
FIG. 3A shows a cross-section view from a diagonal perspective of one annular via.
Figure 3B:
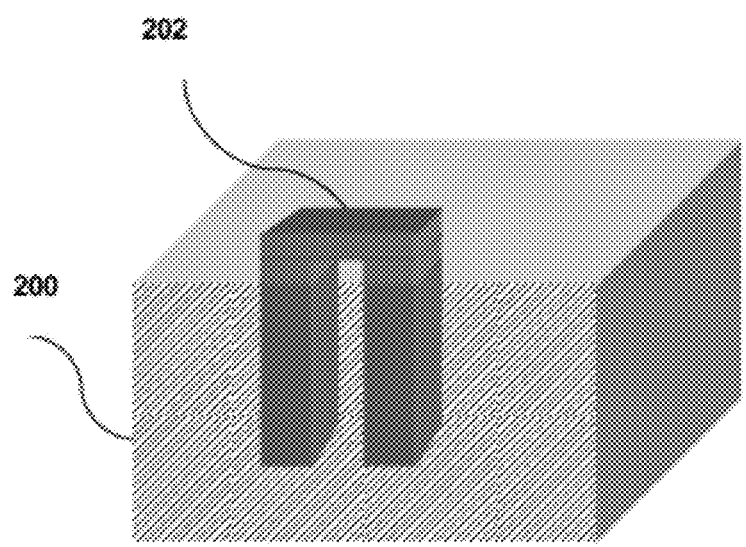
FIG. 3B shows a cross-section view from a diagonal perspective of one slotted via.
Figure 3C:
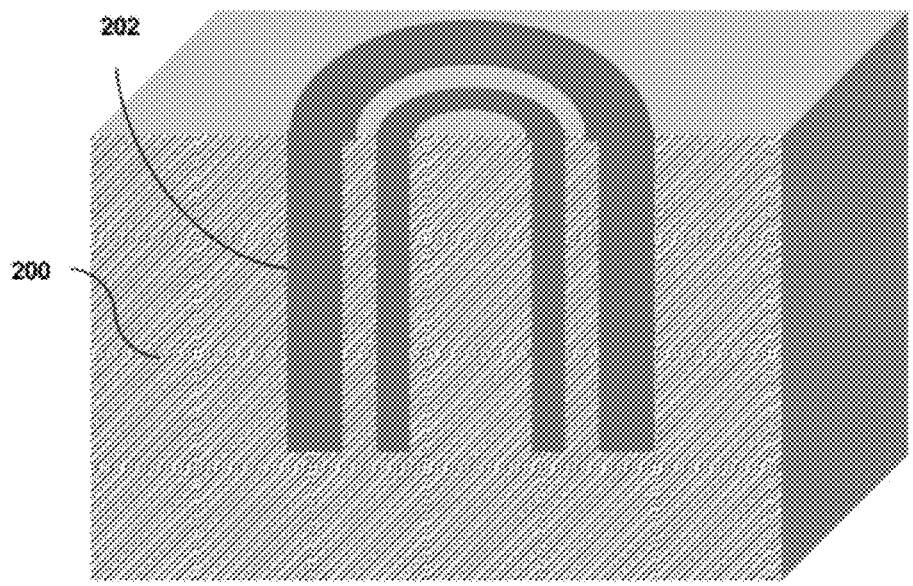
FIG. 3C shows the cross-section view of double annular etched holes.

FIG. 3A shows a cross-section view of one annular etch 202 of the silicon wafer 200, in a diagonal perspective. The view is as though the wafer 200 were sliced down the middle of the circular trench, bisecting the circle. FIG. 3B shows a cross-section view from a diagonal perspective of one slotted via and FIG. 3C shows the diagonal perspective for one double annular via where a larger area may be desired for higher current.

Figure 13:
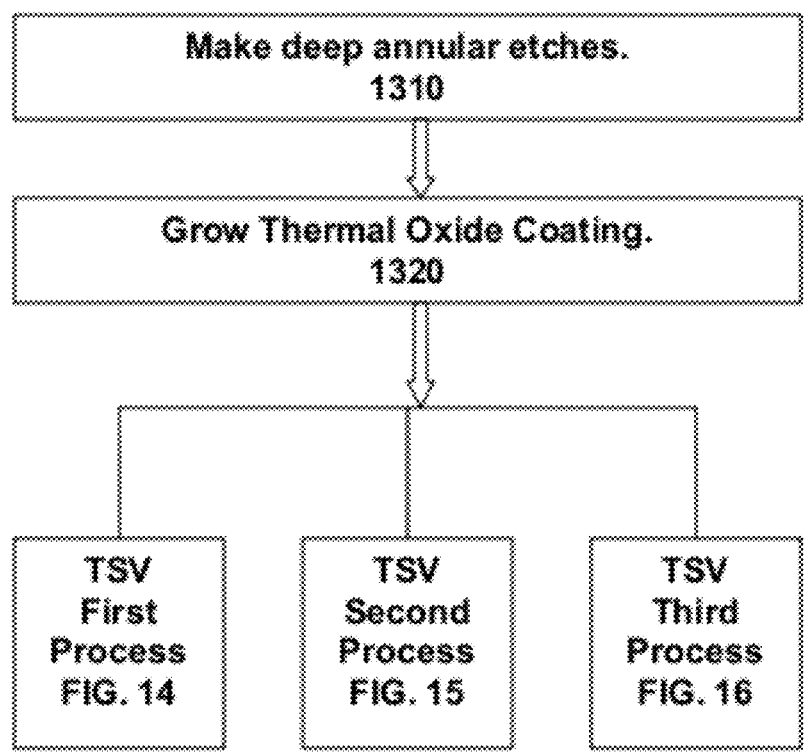
FIG. 13 is a flow chart showing of the process for prefabricating etches using deep silicon etching according to an embodiment of the present invention.

Referring to FIG. 13 there is shown a flow chart of a method according to an embodiment of the present invention. This method for prefabricating a plurality of deep vias on a substrate proceeds as follows:

In step 1310 one or more etches per through-silicon-via (TSV) are created, in addition to one or more TSV's on a silicon wafer or substrate. Exemplary deep annular etches are shown in FIG. 2. This is preferably accomplished using the RIE process. In an exemplary silicon substrate of 2 mm×2 mm or up to sizes of over 40 millimeters in length and 40 mm in width, there may be a plurality of vias. The vias are approximately 10 micrometers deep and 2 micrometers wide. Note that the depth of the initial blind vias is directly related to the ultimate silicon thickness for through silicon vias (TSV) and ultimately for the height per silicon die within the stacked dice.

Next, in step 1320, once the annular vias 202 are fabricated as shown in FIG. 4, a high temperature thermal oxidation (440) of the wafer grows an insulating layer of thermal oxide 420 to coat the entire substrate surface 200. The thermal oxide 420 will also be grown down on the sidewalls of the etched vias both inward and outward from the initial etched Si sidewall from the, annular or bar trenches or vias 202. The thermal oxide coating is grown on the silicon substrate surfaces such that some of the thermal oxide coats or completely fills the sidewalls of the initial via etch and top surface. The thermal oxide 420 is preferably oxidized silicon and it creates electrical insulation in the trenches or vias 202 as SiOx. SiOx is the preferred oxide for a mechanically robust insulator but this invention is not limited to SiOx dielectric insulators.

The insulator thickness can be controlled to optimize both electrical characteristics of the TSV such as capacitance and inductance where thicker oxide for example helps to reduce via capacitance of the final via; and also to minimize wafer and via stress where thicknesses of less than 0.3 microns can provide low stress compared to thick SiOx such as >1 to 2 microns leading to higher stress in wafer and via structure (Each dependent on final product requirements). Subsequent deposition of a Ta/TaN or Ti/TiN liner/barrier can enhance adhesion between the insulator and conductor.

After the thermal oxide is "grown" there are three options for continuation of the process. These three options, first, second, and third, are described below with respect to FIGS. 14, 15, and 16, respectively.

Figure 14:
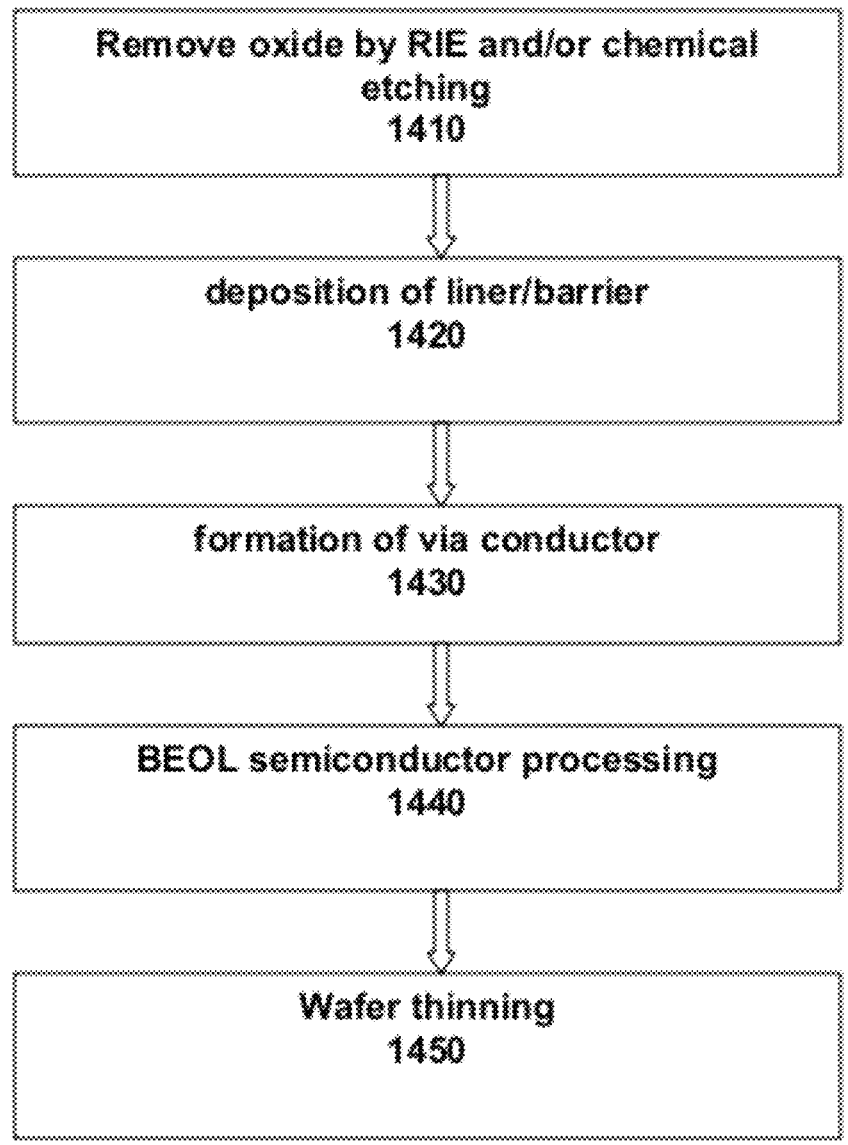
FIG. 14 is a flow chart of the TSV first process, according to an embodiment of the present invention.

FIG. 14 is a flow chart of the method steps for a "TSV first process." In step 1410 one continues the wafer build using this first process by removing oxide over an inner diameter of each of the intended vias by RIE and/or chemical etching. For alternate designs, for example double annular designed vias could be fabricated by removing oxide from each intended TSV in the middle annular ring between an inner post or ring of SiOx and an outer ring of SiOx.

This is followed by deposition of a liner/barrier in step 1420, formation of the via conductor in step 1430, and process build of one or more wiring levels on the structure for signal, voltage and ground interconnection and top surface or interconnection pads using traditional back-end-of-line (BEOL) semiconductor processing in step 1440. This is then followed by wafer thinning from the back side of the wafer in step 1450 (with or without a mechanical handler to support the wafer) such that in the final structure, the thinned silicon can have oxide deposited on the backside where needed as a dielectric and the TSV conductors can be contacted and any additional interconnection pad structure if needed can be fabricated onto the conductor and over the dielectric.

Figure 15:
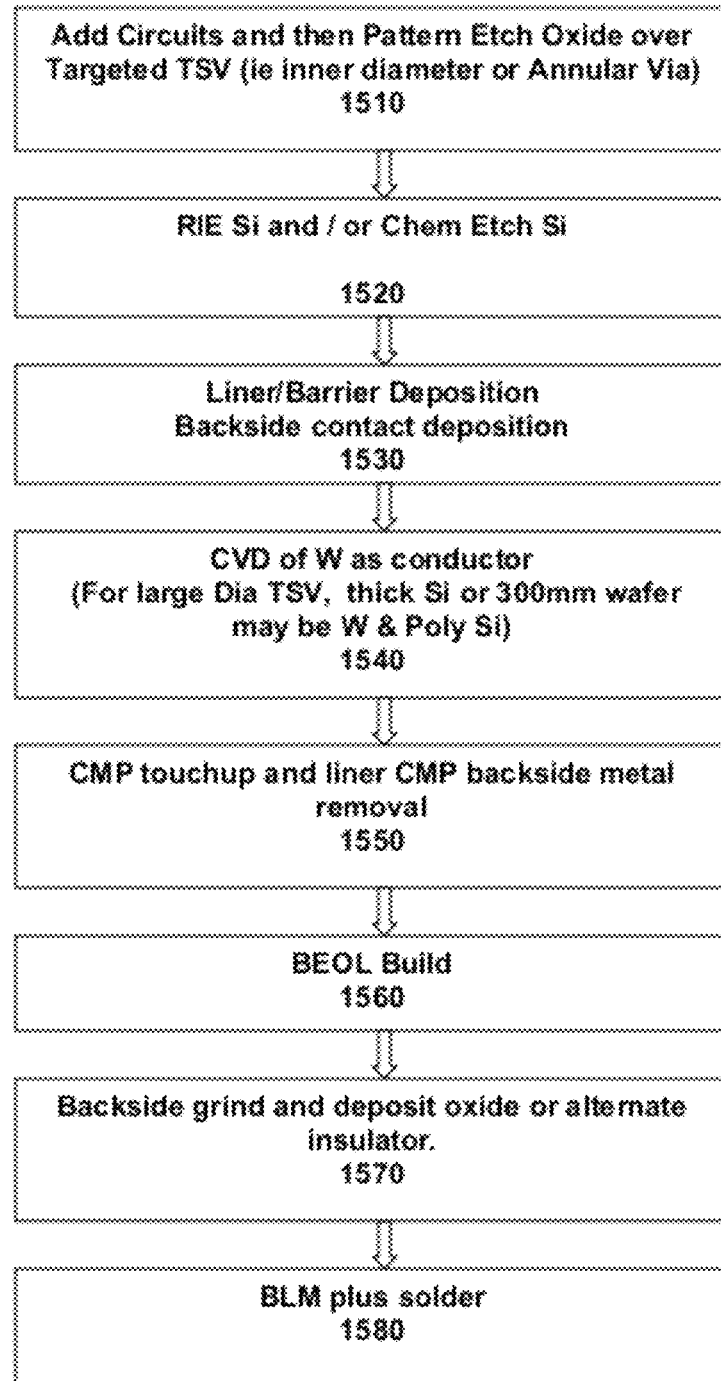
FIG. 15 is a flow chart of the TSV second process, according to an embodiment of the present invention.

FIG. 15 is a flow chart of the process steps for a "TSV second process." If the second option is selected, one continues to fabricate the semiconductor wafer active transistor circuits and wiring or passive circuits often referred to semiconductor front-end-of-line (FEOL) processes. In step 1510 FEOL active circuits (510) or passive circuits are added to the wafer and then an oxide etch 420 is patterned over the desired TSV or in this example the inner diameter of the vias 220, as shown in FIG. 5.

Subsequent to the FEOL processing, in step 1520 the intended TSV's areas have any dielectric removed by etching, or alternate means. In this step a deeper trench is made, as shown in FIG. 6. Here the etch may be made by RIE, chemical etching or a combination of these. In the "TSV third process" to be described below, the TSV etch may be done after thinning the wafer.

In step 1530 a liner/barrier is formed. This liner/barrier can be Ti/TiN or Ta/TaN. FIG. 7 illustrates a liner/barrier deposition 720 using an ALD (atomic layer deposition). This is followed by the TSV conductor deposition such as but not limited to CVD tungsten (W) or plated copper (Cu) vias using Cu plating. Backside contact metal deposition for current plating tool is only applied to the copper plate up. Any excess W or Cu deposition on the surface may be removed by means of chemical-mechanical polishing, cleans and bakes and then continued wafer processing can continue to create BEOL wiring.

Figure 8:
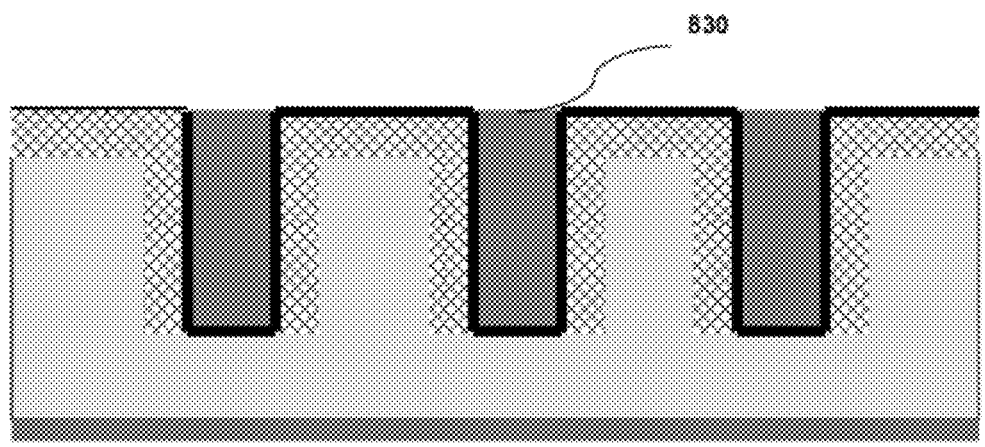
FIG. 8 illustrates a BEOL build.

In step 1540 the chemical vapor deposition (CVD) of tungsten (W) is used as conductor. See FIG. 8 which illustrates the use of CVD of W as a conductor—or—a copper plate.

Figure 9:
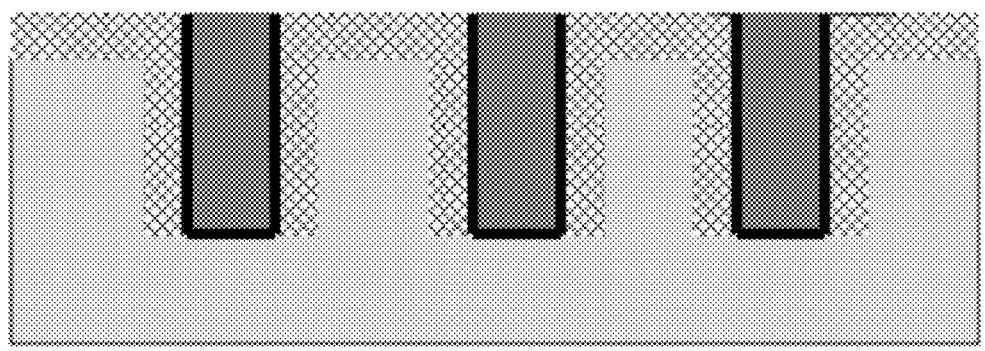
FIG. 9 illustrates a chemical mechanical planarization (CMP) touchup and the liner CMP backside metal removal.
Figure 10:
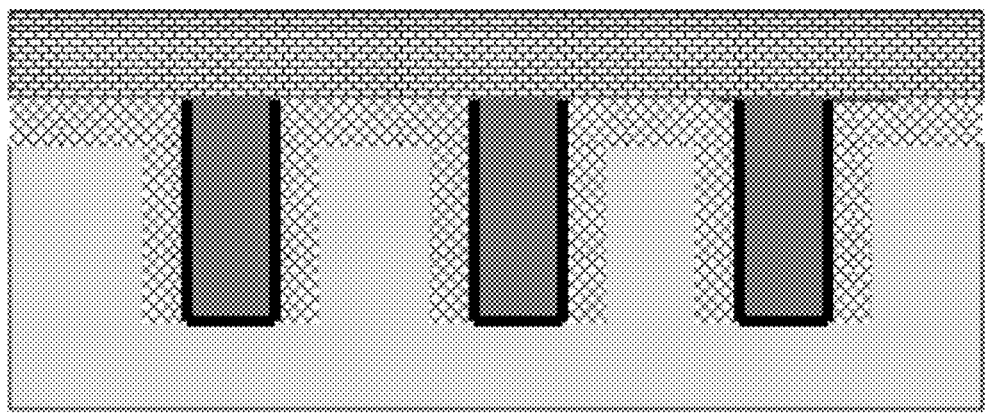
FIG. 10 illustrates the back end of line buildup.
Figure 11:
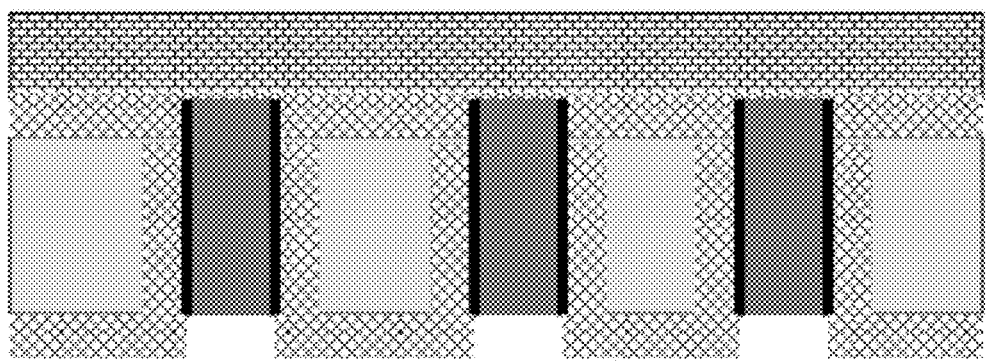
FIG. 11 illustrates a backside grind and oxide deposition or alternate insulator.

Continuing with step 1550, the chemical mechanical planarization (CMP) touchup is done and the liner CMP backside metal is removed. See FIG. 9. In step 1560 the BEOL (Back-End-Of-Line) metallization structures used in semiconductor build takes place. FIG. 9 illustrates CMP touchup plus Liner CMP backside metal removal. Next in step 1580 the backside is ground to expose the contacts and oxide is deposited. FIG. 10 is intended to illustrate any added wiring or BEOL operations that would then be followed by backside grind steps and polish, chemical-mechanical polish, oxide deposit (or an alternate insulator), and oxide etch to open to the TSV conductor as illustrated in FIG. 11.

Figure 12:
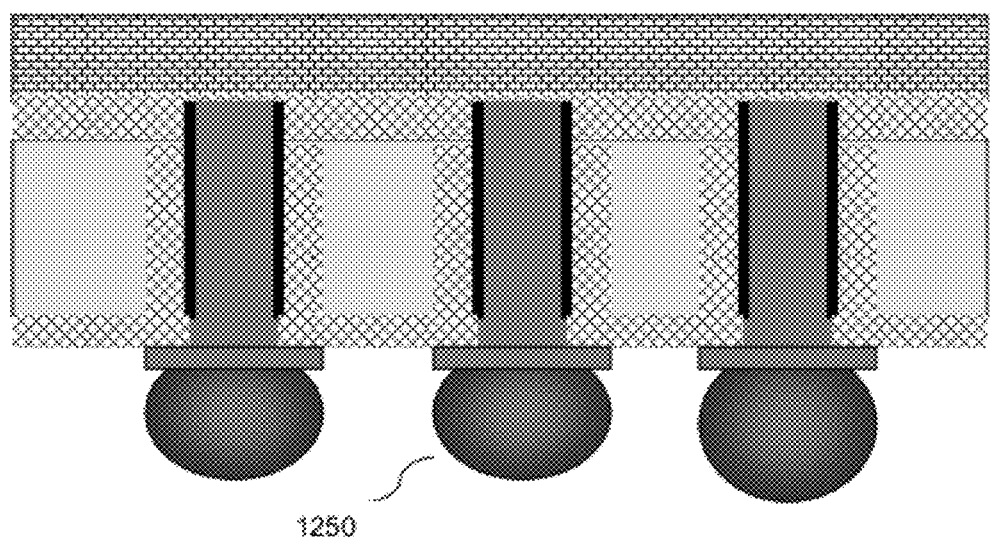
FIG. 12 illustrates a step of adding a BLM and solder to the substrate.

In step 1580 ball limited metallurgy pads (BLM) are deposited such as but not limited to Ti/Cu/Ni/Au and solders balls 1250 are added to the substrate as shown in FIG. 12. The solder balls 1250 are able to adhere to the surface by known ball limiting metallurgy (BLM) plus the plated or injection molded solder attach or alternative solder application. The BLM contains the solder ball 1250 in the target area, and provides adhesion and contact to the chip wiring.

Wafers can be thinned such as with wafer grinding coarse, wafer grinding fine and polishing, and again forming a backside interconnection to the TSV such as described in FIG. 14.

Figure 16:
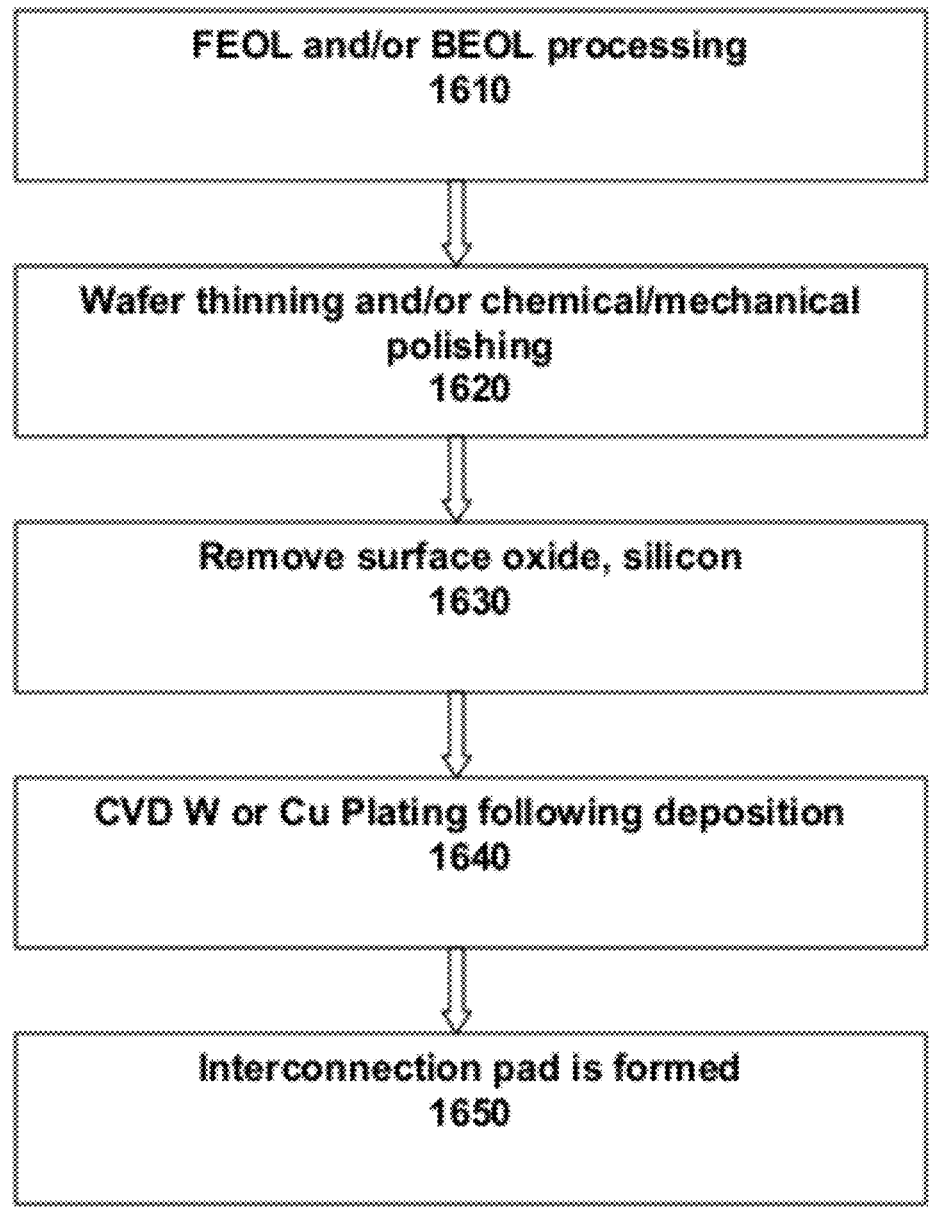
FIG. 16 is a flow chart of the TSV third process, according to an embodiment of the present invention.

FIG. 16 is a flow chart of the third process for creating a TSV. A wafer with the preliminary etched and oxidized structures described above in FIG. 13 is first processed through FEOL and/or BEOL processing in step 1610.

In step 1620 the wafer thinning operation and/or chemical-mechanical polishing process is done. In step 1630, after thinning and/or chemical-mechanical processing the oxide or nitride depositions such as with PECVD, the surface oxide and/or nitride is selectively removed from over the area to become the TSV. The silicon is removed using RIE or chemical etch (using the previously created oxide side walls and bottom surface as an etch stop and contacting to the conductor vias or pads which were previously fabricated during the FEOL and/or BEOL processing steps when processing the top side of the wafer).

In step 1640 the conductor is deposited or plated such as with CVD W or Cu plating, respectively, following a Ti/TiN or Ta/TaN liner/barrier deposition and finally in step 1650 an interconnection pad is formed contacting the via and overlying the dielectric or as needed such as a ball limiting metallurgy (BLM) pad where solder can then be plated or applied such as with injection molding or alternate process In each of the above TSV processes, for W fill or Cu fill, if needed a combination of W and polysilicon or Cu and polysilicon may be deposited in the TSV structure by first depositing some coating layer of W or Cu and then completing fill with polysilicon or alternatively some composite of these materials in the TSV in order to minimize mechanical stress during wafer processing, and to minimize bowing and handling and to help fully fill the vias. In each case or as is needed during processing, a chemical-mechanical polish may be used to remove surface W or Copper and clean or bake operations may be needed prior to polysilicon deposition. In this way, larger vias if needed can be fabricated and/or larger diameter wafers can be processed such as 300 mm wafers while controlling both the maximum stress level for conductor deposition thickness which if not managed could lead to excessive bow or non-coplanarity which may cause yield loss or inability to process the wafers as well as manage the stress in the TSV in the final structures. for improved reliability The small diameter of the vias reduces stress due to different coefficients of thermal expansion and minimizes loss of active circuit area for chips or die stacks. In an alternative embodiment, a copper via can be fabricated for lower resistance applications.

Therefore, while there has been described what are presently considered to be the preferred embodiments, it will understood by those skilled in the art that other modifications can be made within the spirit of the invention.

The invention claimed is:

1. A semiconductor structure comprising:
   at least one silicon surface;
   at least one electronic circuit formed on each side of the at least one silicon surface; and
   at least one thermal oxide dielectric coating the entire at least one silicon surface;
   at least one conductive high aspect ratio through silicon via disposed through the at least one silicon surface;
   wherein the through silicon via comprises:
   a thermal oxide collar defining a circumference of the through silicon via;
   etch stops as barriers;
   a liner/barrier over the thermal oxide collar;
   an insulator covering a surface of the silicon that is opposite the at least one silicon surface;
   metallization structures over the liner/barrier; and
   an interconnection pad on the insulator covering a surface of the silicon that is opposite the at least one silicon surface.

2. The semiconductor structure of claim 1, wherein the through silicon via comprises tungsten.

3. The semiconductor structure of claim 2, wherein the through silicon via further comprises polysilicon.

4. The semiconductor structure of claim 1, wherein the through silicon via comprises copper.

5. The semiconductor structure of claim 4, wherein the through silicon via further comprises polysilicon.

6. The semiconductor structure of claim 1 wherein the through silicon via has a width ranging from 0.2 to 8 microns.

7. The semiconductor structure of claim 1 wherein the at least one electronic circuit comprises active circuits.

8. The semiconductor structure of claim 1 wherein the at least one electronic circuit comprises passive circuits.

9. The semiconductor structure of claim 1 wherein the at least one through silicon via comprises an annular shape.

10. The semiconductor structure of claim 9 wherein the annular shape comprises a double annular configuration.

11. The semiconductor structure of claim 1 wherein the at least one through silicon via has a depth of approximately 2 to 150 microns.

12. The semiconductor structure of claim 1 wherein the at least one silicon surface comprises a wafer surface.

13. The semiconductor structure of claim 1 wherein the at least one silicon surface comprises a substrate surface.

* * * * *